US006232251B1

(12) United States Patent
Terashi et al.

(10) Patent No.: US 6,232,251 B1
(45) Date of Patent: May 15, 2001

(54) DIELECTRIC CERAMICS

(75) Inventors: Yoshitake Terashi; Shinya Kawai; Tetsuya Kimura; Hitoshi Kumatabara; Yasuhide Tami, all of Kagoshima-ken (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/408,888

(22) Filed: Sep. 29, 1999

(30) Foreign Application Priority Data

| Sep. 29, 1998 | (JP) | 10-276260 |
| Nov. 9, 1998 | (JP) | 10-317736 |
| Dec. 22, 1998 | (JP) | 10-365401 |
| Feb. 26, 1999 | (JP) | 10-050311 |

(51) Int. Cl.$^7$ .......................... C03C 10/04; C03C 14/00; C03C 4/16

(52) U.S. Cl. .................... 501/5; 501/4; 501/10; 501/32; 428/901

(58) Field of Search .................. 501/5, 10, 32, 501/4; 428/901, 469, 471

(56) References Cited

U.S. PATENT DOCUMENTS

| 4,853,349 | * | 8/1989 | Martin | 501/8 |
| 5,763,059 | * | 6/1998 | Yamaguchi et al. | 501/11 |
| 5,821,181 | * | 10/1998 | Bethke et al. | 501/8 |
| 5,889,322 | * | 3/1999 | Hamada et al. | 257/701 |
| 6,121,174 | * | 9/2000 | Yokoi et al. | 501/8 |

* cited by examiner

*Primary Examiner*—Karl Group
(74) *Attorney, Agent, or Firm*—Hogan & Hartson, LLP

(57) ABSTRACT

Dielectric ceramics comprising a diopside oxide crystal phase, at least one kind of crystal phase selected from the group consisting of a quartz crystal phase and a composite oxide crystal phase containing Ti and Mg or Zn, and a glass phase of an amount of not larger than 30% by weight, said dielectric ceramics having a coefficient of thermal expansion of not smaller than 5.5 ppm/° C. at room temperature to 400° C. and a dielectric loss of not larger than $30\times10^{-4}$ at 60 to 77 GHz. The ceramics can be obtained by the co-firing with a low-resistance metal such as copper or silver, and can be advantageously used for the production of wiring boards to which the signals of particularly high frequencies are applied. The ceramics has a large coefficient of thermal expansion which can be brought close to the coefficient of thermal expansion of the semiconductor element such as of GaAs or of the printed board. The wiring board produced by using the ceramics effectively prevents breakage in the mounting portion of the wiring board that is caused by a difference in the thermal expansion.

11 Claims, 1 Drawing Sheet

DIELECTRIC CERAMICS

BACKGROUND OF THE INVENTION

1. Field of the Invention

The present invention relates to dielectric ceramics suited for forming insulating substrates that serve as skeletons for packages for containing semiconductors and for various wiring boards such as multi-layer wiring boards, and to a method of producing the same. In particular, the invention relates to dielectric ceramics having a low dielectric loss in high-frequency regions, that can be produced by the co-firing with a low-resistance conductor such as copper, gold or silver, and to a method of producing the same.

2. Description of the Prior Art

There have been widely used ceramic wiring boards having a wiring layer of a high-melting point metal such as tungsten or molybdenum formed on the surface or inside of an insulating substrate of an aluminous sintered product.

Accompanying the trend toward highly sophisticated information technology in recent years, the frequency band of signals applied to the wiring boards is shifting to ever high frequency regions. In the wiring board that must transfer signals of such high frequencies, the conductor forming the wiring layer must have a small resistance to transmit high-frequency signals without loss and the insulating substrate must have a small dielectric loss in the high-frequency regions.

However, the above-mentioned wiring layer formed on the conventional ceramic wiring board, i.e., the wiring layer formed of a high-melting point metal such as tungsten or molybdenum, has a large resistance and permits signals to propagate at a slow speed. Besides, the above-mentioned wiring layer is not capable of transmitting signals of frequencies not smaller than 1 GHz. It therefore becomes necessary to form a wiring layer using a low-resistance metal such as copper, silver or gold instead of tungsten or molybdenum. However, such low-resistance metals have low-melting points, and are not capable of forming a wiring layer by the co-firing with alumina.

In recent years, therefore, there has been developed a wiring board using an insulating substrate made of a so-called glass ceramics comprising a composite material of a glass and ceramics. The glass ceramics has a dielectric constant of as low as about 3 to about 7, is suited for transmitting high-frequency signals compared with alumina ceramics, and is obtained by the firing at a temperature as low as from 800 to 1000° C., and has an advantage in that it can be co-fired with a low-resistance metal such as copper, gold or silver.

For example, Japanese Unexamined Patent Publication (Kokai) No. 240135/1985 proposes a wiring board obtained by co-firing a green sheet together with a wiring pattern of a low-resistance metal, the green sheet comprising a filler such as $Al_2O_3$, zirconia or mullite and a zinc borosilicate glass.

Besides, Japanese Unexamined Patent Publication (Kokai) No. 298919/1993 proposes a glass ceramics obtained by precipitating mullite or cordierite as a crystal phase.

The above-mentioned conventional glass ceramics can be formed by the co-firing with a low-resistance metal, but has a defect of low coefficient of thermal expansion (about 3 to about 5 ppm/° C.).

The wiring board has various electronic parts (e.g., chips of GaAs) mounted thereon and is used being mounted on a printed board such as mother board formed of an organic resin. The mounting is effected relying on the so-called brazing generating, however, thermal stress. Further, thermal stress generates between the wiring board and the printed board due to thermal hysteresis of when the semiconductor element is operated and stopped repetitively. Here, the chip such as GaAs has a coefficient of thermal expansion of from 6 to 7.5 ppm/° C., the printed board has a coefficient of thermal expansion of from 12 to 15 ppm/° C., and the above-mentioned glass ceramics has a coefficient of thermal expansion which is greatly different therefrom. In the wiring board having an insulating substrate formed of the conventional glass ceramics, therefore, the mounting portion is peeled or is cracked due to thermal stress at the time of mounting or due to thermal stress when the semiconductor element is operated and stopped repetitively as a result of the above-mentioned great difference in the coefficient of thermal expansion. Therefore, such wiring boards have a very low reliability concerning the mounting and are not satisfactory for being practically used.

Further, the conventional glass ceramics has a large dielectric loss in the high-frequency regions, and the wiring board equipped with the insulating substrate of the glass ceramics fails to exhibit satisfactory high-frequency characteristics and cannot be used as a high-frequency wiring board for handling high-frequency signals such as of microwaves and millimeter waves.

SUMMARY OF THE INVENTION

It is therefore an object of the present invention to provide ceramics for a wiring board that can be formed by the co-firing with a low-resistance metal such as gold, silver or copper, has a coefficient of thermal expansion close to that of a chip such as GaAs or of a printed board, and has a low dielectric loss in the high-frequency regions, and to a method of producing the same.

According to the present invention, there is provided dielectric ceramics comprising:

a diopside oxide crystal phase;
  at least one kind of crystal phase selected from the group consisting of a quartz crystal phase and a composite oxide crystal phase containing Ti and Mg or Zn; and
  a glass phase of an amount of not larger than 30% by weight;
  said dielectric ceramics having a coefficient of thermal expansion of not smaller than 5.5 ppm/° C. at room temperature to 400° C. and a dielectric loss of not larger than $30 \times 10^{-4}$ at 60 to 77 GHz.

According to the present invention, there is further provided a method of producing dielectric ceramics by molding, into a predetermined shape, a mixture powder comprising 50 to 99% by weight of a glass powder containing $SiO_2$, $Al_2O_3$, MgO and CaO, and capable of precipitating a diopside oxide crystal phase, and 1 to 50% by weight of at least one kind of an oxide powder selected from the group consisting of an $SiO_2$ powder and a composite oxide powder containing Ti and Mg or Zn, followed by firing at a temperature of from 800 to 1000° C.

In this specification, the coefficient of thermal expansion is in a temperature range of from room temperature (25° C.) to 400° C. unless stated otherwise.

DETAILED DESCRIPTION OF THE INVENTION

Dielectric Ceramics

Figure 1:
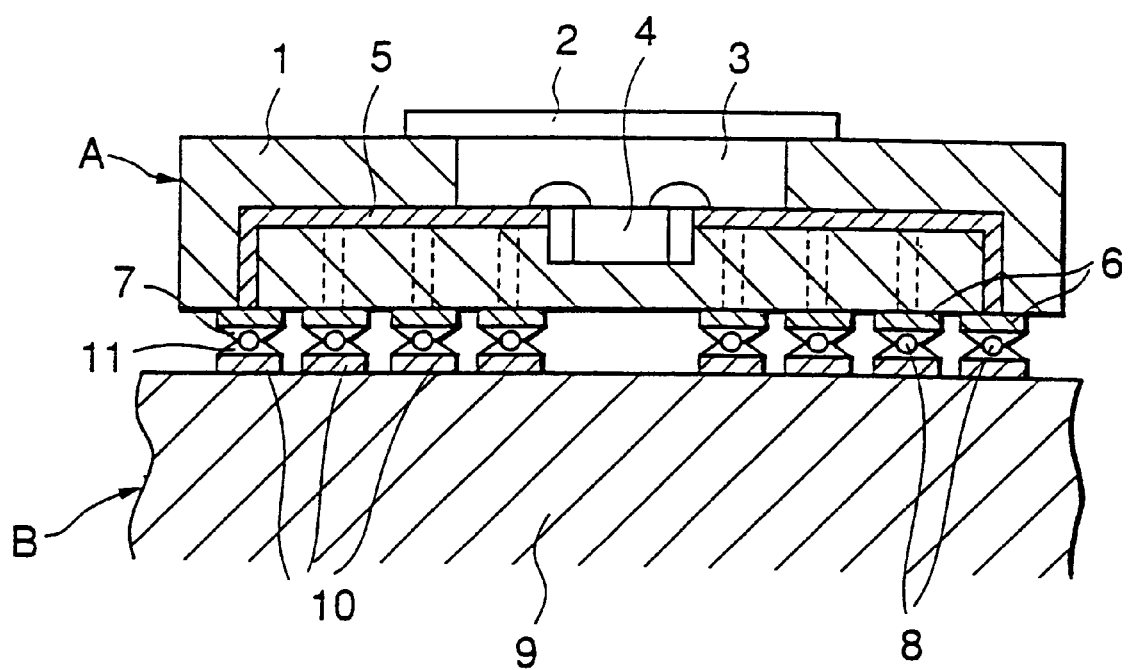
FIG. 1 is a sectional view schematically illustrating the mounting structure of a semiconductor package (mounting a semiconductor element) equipped with an insulating substrate formed by using dielectric ceramics of the present invention.

The dielectric ceramics of the present invention has a distinguished feature in that it has a diopside oxide crystal phase and that the content of the glass phase is suppressed to be not larger than 30% by weight.

Ideally, the composition of the diopside oxide crystal phase is expressed by the following formula, $$CaMgSi_2O_6$$

In general, however, aluminum exists in the form of a solid solution substituting for a part of Mg site or Si site as represented by the following formula, $$Ca(Mg,Al)(Si,Al)_2O_6$$

Further, Sr may be substituted for a part of Ca site to exist in the form of a solid solution. The diopside oxide crystal phase exhibits a small dielectric loss in a high-frequency region, and a coefficient of thermal expansion of as large as about 8 to 9 ppm/° C. Its dielectric constant is from 6 to 8.

As will be described later, further, the diopside oxide crystal phase precipitates upon firing a glass powder containing CaO, $Al_2O_3$, MgO and $SiO_2$ and, hence, the glass phase (amorphous phase) precipitates inevitably. The glass phase, generally, exhibits a large dielectric loss in the high-frequency regions and has a coefficient of thermal expansion of as low as from 4 to 5 ppm/° C. In the dielectric ceramics of the present invention, however, the diopside oxide crystal phase is precipitated from the glass powder, the content of the glass phase being suppressed to be not larger than 30% by weight.

That is, the dielectric ceramics of the present invention permits the diopside oxide crystal phase having the above-mentioned properties to be precipitated, while suppressing the precipitation of the glass phase and, hence, exhibits a dielectric loss at 60 to 77 GHz of not larger than $30 \times 10^{-4}$ and, particularly, not larger than $20 \times 10^{-4}$ and a coefficient of thermal expansion of not smaller than 5.5 ppm/° C. For example, when the precipitating amount of the diopside oxide crystal phase is small and the content of the glass phase is larger than 30% by weight, the dielectric loss increases in the high-frequency regions and the coefficient of thermal expansion decreases. Further, the glass phase containing much $Al_2O_3$ and MgO exhibits an increased dielectric loss in the high-frequency regions. According to the present invention, therefore, it is desired that not less than 70% by weight of the glass phase is the amorphous silica ($SiO_2$).

It is further important that the dielectric ceramics of the present invention contains, as another crystal phase, at least one kind of crystal phase selected from the group consisting of a quartz crystal phase and a composite oxide crystal phase containing Ti and Mg or Zn. Upon precipitating such quartz crystal phase and composite oxide crystal phase, it is allowed to adjust the coefficient of thermal expansion and the dielectric constant without causing the dielectric loss to increase in the high-frequency regions.

For example, the quartz crystal phase has a small dielectric loss in the high-frequency regions, a coefficient of thermal expansion of as very large as from 13 to 20 ppm/° C., and a dielectric constant of from 4 to 4.5. Upon precipitating the quartz crystal phase, therefore, the coefficient of thermal expansion can be increased to be not smaller than 8.5 ppm/° C. and the dielectric constant can be adjusted to be not larger than 7.

When the ceramics having a low dielectric constant is used as a wiring board, it is allowed to decrease the transmission loss for the high-frequency signals.

As the composite oxide crystal phase containing Ti and Mg or Zn, there can be exemplified an ilmenite crystal phase represented by the following formula, $$MgTiO_3 \text{ or } Mg_{(1-x)}Zn_xTiO_3$$

or a spinel crystal phase represented by the following formula, $$Mg_2TiO_4 \text{ or } Zn_2TiO_4$$

These crystal phases, too, have small dielectric losses in the high-frequency regions and coefficients of thermal expansion of as large as from 7 to 8 ppm/° C. Upon precipitating the composite oxide crystal phase, therefore, it is allowed to adjust the coefficient of thermal expansion to be not smaller than 7 ppm/° C. The composite oxide crystal phase has a high dielectric constant enabling the dielectric ceramics to possess a dielectric constant of not lower than 8 and, particularly, not lower than 9. When the ceramics having a particularly high dielectric constant is used as an insulating substrate for the wiring board, impedance favorably matches with the wiring layer formed on or inside the insulating substrate, making it possible to narrow the width of the wiring layer and to highly densely form fine wiring layers, offering a great advantage from the standpoint of decreasing the size of the wiring board.

It is desired that the above-mentioned quartz crystal phase or the composite oxide crystal phase is contained in an amount of from 1 to 50% by weight in the dielectric ceramics. When its amount exceeds 50% by weight, it becomes difficult to obtain a densely sintered product (dielectric ceramics) by firing at 800 to 1000° C. as well be described later. When its amount is smaller than 1% by weight, it becomes difficult to adjust the dielectric constant and the coefficient of thermal expansion.

In addition to the above-mentioned phases, the dielectric ceramics of the present invention may contain a $MgSiO_3$ crystal phase or a $Mg_2SiO_4$ crystal phase. By precipitating such crystal phases, the dielectric loss of the dielectric ceramics become smaller. These crystal phases have low dielectric losses in the high-frequency regions, coefficients of thermal expansion of from 7 to 9 ppm/° C. and dielectric constants of 5 to 6. Even by precipitating these crystal phases, therefore, it is made possible to adjust the coefficient of thermal expansion and the dielectric constant without increasing the dielectric loss in the high-frequency regions. It is desired that the content of these crystal phases is generally from 0.1 to 20% by weight calculated as MgO.

In the dielectric ceramics of the present invention, other metal components stemming from unavoidable impurities may exist in the form of solid solutions in the crystal phases as far as the crystal phases do not lose their properties. In precipitating the crystal phases, furthermore, there may be incidentally precipitated oxide phases such as $TiO_2$ phase and crystal phases having large coefficients of thermal expansion close to that of the diopside oxide crystal phase, such as $Ca_2MgSi_2O_7$ (akermanite), $CaMgSiO_4$ (monticellite) and $Ca_3MgSi_2O_8$ (merwinite).

As described above, the dielectric ceramics of the present invention exhibits a small dielectric loss in the high-frequency regions, can be very effectively used as an insulating substrate in the wiring board to which are applied signals of particularly high frequencies, and makes it possible to adjust the difference in the coefficient of thermal expansion to be not larger than 2 ppm/° C. from that of the chip such as GaAs or that of the printed board upon adjusting the coefficient of thermal expansion. By using the dielectric ceramics, therefore, it is allowed to obtain a wiring board having improved reliability in the mounted structure of the chip and the printed board.

Preparation of the Ceramics for the Wiring Board

The above-mentioned dielectric ceramics of the present invention can be prepared by mixing powders that are sources of precipitating the crystal phases, blending the mixture powder with a suitable organic binder to prepare a slurry and molding the slurry into a predetermined shape, and firing the molded article at a temperature of from 800 to 1000° C.

Starting Materials

In the present invention, a glass powder having a softening point of from 500 to 800° C. is particularly desirably used as a source of precipitating the diopside oxide crystal phase. The glass powder contains at least $SiO_2$, $Al_2O_3$, MgO and CaO components. In order to precipitate the diopside oxide crystal phase, however, it is desired that $SiO_2$ is contained in an amount of from 45 to 55% by weight, $Al_2O_3$ is contained in an amount of from 3 to 10% by weight, MgO is contained in an amount of from 13 to 24% by weight, and CaO is contained in an amount of from 20 to 30% by weight. From the standpoint of precipitating the diopside oxide crystal phase in a sufficiently large amount, in particular, it is desired that the total amount of CaO and MgO is from 35 to 50% by weight.

From the standpoint of conducting the firing at a low temperature, further, it is desired that the glass powder contains SrO. In this case, $SiO_2$, $Al_2O_3$ and MgO may be contained in the glass powder in amounts same as those described above, but it is desired that CaO is contained in an amount of from 8 to 24% by weight and SrO is contained in an amount of from 10 to 24% by weight. In order to precipitate the diopside oxide crystal phase in a sufficiently large amount, in particular, it is desired that the total amount of CaO and MgO is from 20 to 40% by weight. Use of the SrO-containing glass powder makes it possible to obtain a densely sintered product upon the firing at a temperature of, for example, not higher than 900° C.

Upon firing the glass powder having the above-mentioned composition, the diopside oxide crystal phase precipitates simultaneously with the glass phase. When the SrO-containing glass powder is used, SrO partly substitutes for a part of Ca site in the diopside oxide crystal phase and the remaining SrO precipitates in the glass phase. In the present invention as described earlier, it is desired that not less than 70% by weight of the glass phase is amorphous $SiO_2$. In order to precipitate such a glass phase, however, it is desired that the content of $SiO_2$ in the glass powder is as large as possible compared to the contents of other components.

The above-mentioned glass powder is mixed to the powders that serve as sources for precipitating other crystal phases. Here, the content of the glass powder in the mixture powder is from 50 to 99% by weight and, particularly, from 60 to 80% by weight. When the content of the glass powder is smaller than 50% by weight, it becomes difficult to conduct the firing at a temperature of lower than 1000° C. When the content exceeds 99% by weight, the glass phase exhibiting large dielectric loss precipitates in large amounts (ratio of the diopside oxide crystal phase decreases), and the obtained ceramics exhibit an increased dielectric loss in the high-frequency regions.

As the source of precipitating the quartz crystal phase, there can be used an amorphous silica powder though the quartz powder is usually used. That is, amorphous silica forms the quartz crystal phase upon firing and cooling. The powder which is the source for precipitating the quartz crystal phase is used being mixed in the mixture powder in an amount of from 1 to 50% by weight and, particularly, from 15 to 40% by weight.

As a source for precipitating the composite oxide crystal phase containing Ti and Mg or Zn, such as ilmenite crystal phase and spinel crystal phase, there can be used a MgO powder, a ZnO powder and a $TiO_2$ powder in combination. Particularly, however, it is desired to use a powder of a composite oxide such as $MgTiO_3$, $ZnTiO_3$ or $(Mg, Zn)TiO_3$. The powder serving as the source for precipitating the composite oxide crystal phase is used being mixed in the mixture powder in an amount of from 1 to 50% by weight and, particularly, from 10 to 30% by weight.

As the sources for precipitating the $MgSiO_3$ crystal phase and the $Mg_2SiO_4$ crystal phase, there can be used powders of Mg compounds such as MgO, $MgCO_3$ and $Mg(OH)_2$, as well as a powder of a composite oxide of Mg and Si (e.g., $MgSiO_3$, $Mg_2SiO_4$). In this case, the Mg compound reacts with $SiO_2$ in the glass powder upon firing to precipitate $MgSiO_3$ crystal phase or $Mg_2SiO_4$ crystal phase. The powder which is the source of precipitating these crystal phases is used being mixed in the mixture powder in an amount of from 0.1 to 20% by weight calculated as MgO.

As described above, the glass powder which is the source of precipitating the diopside oxide crystal phase is mixed with suitable amounts of powders that serve as sources for precipitating other crystal phases, thereby to prepare a starting powder for the dielectric ceramics of the present invention.

Molding and Firing

The above-mentioned mixture powder which is the starting material is dispersed in a suitable organic binder that is known per se to prepare a slurry from which a sheet-like molded article (green sheet) is obtained based on a known means, such as doctor blade method, calender roll method, rolling method or press-molding method. The green sheet is then fired in an oxidizing or non-oxidizing atmosphere at a temperature of 800 to 1000° C. to obtain dense dielectric ceramics having a relative density of, for example, not smaller than 97%. In this case, when the SrO-containing glass powder is used as a source for precipitating the diopside oxide crystal phase, the firing can be conducted at a temperature of not higher than 900° C. as described earlier.

According to the present invention as described above, the dielectric ceramics is obtained by firing at a temperature of 800 to 1000° C. In the step of preparation, therefore, the dielectric ceramics can be fired simultaneously with a low-resistance metal such as copper, gold or silver, and can be very effectively used for the preparation of a wiring board having the low-resistance metal as a wiring layer. Besides, the dielectric ceramics of the present invention has a low dielectric loss in the high-frequency regions, and can be effectively used for the preparation of a high-frequency wiring board to which are applied signals of high frequencies of not lower than 1 GHz, particularly, not lower than 20 GHz, more particularly, not lower than 50 GHz and, further preferably, not lower than 70 GHz.

Wiring Board

By using the ceramics of the present invention, the wiring board is prepared as described below.

A green sheet having a composition corresponding to the ceramics of the present invention is prepared according to the method described above. If necessary, through holes are formed in the green sheet and are filled with a metal paste containing a low-resistance metal such as copper, gold or silver. Then, the metal paste is applied onto the green sheet in the form of a pattern of a wiring layer (about 5 to about 30 $\mu$m thick) by the screen printing method, gravure printing method or the like method. A plurality of green sheets having wiring patterns formed thereon are overlapped one upon the other in a manner that the through holes are in agreement, adhered with the application of pressure, and are simultaneously fired at 800 to 1000° C. in an oxidizing atmosphere or in a nonoxidizing atmosphere ($N_2$, $N_2+H_2$, etc.) to obtain an insulating substrate formed of ceramics of the present invention and to obtain a wiring board of a structure having a wiring layer formed inside or on the surface of the insulating substrate.

A chip is mounted on the wiring board, and the wiring layer on the wiring board is connected to the chip in a manner that the signals can be transmitted. This connection is accomplished by, for example, directly mounting the chip on the wiring layer, or by fastening the chip on the insulating substrate using a suitable adhesive and connecting the chip to the wiring layer by bonding wires or by using a TAB tape. As the chip, there can be used a semiconductor element such as of Si or GaAs. According to the present invention, however, there can be advantageously used a GaAs semiconductor element having a particularly large coefficient of thermal expansion (6 to 7.5 ppm/° C.) in order to bring the coefficient of thermal expansion of the insulating substrate close to that of the chip and to enhance the reliability of mounting.

Further, a cap made of the same material as the insulating substrate, or any other insulating material, or a metal having good heat-radiating property, is joined onto the surface of the wiring board on which is mounted a chip such as semiconductor element using an adhesive such as glass, resin or brazing material, in order to air-tightly seal the chip.

FIG. 1 illustrates a wiring board made of ceramics of the present invention, the wiring board being used as a package mounting a semiconductor element. In FIG. 1, the package A is the one of the ball grid array (BGA) type having connection terminals in the form of balls, and further having an insulating substrate 1 and a closure 2. A cavity 3 is defined by the insulating substrate 1 and the closure 2, and a chip 4 such as of GaAs is mounted in the cavity 3. The insulating substrate 1 is made of the above-mentioned ceramics of the present invention.

A wiring layer 5 is formed on the surface of the insulating substrate 1, and the semiconductor element 4 in the cavity 3 is electrically connected to the wiring layer 5 so that high-frequency signals can be transmitted relative to the wiring layer 5. The connection is accomplished by mounting the semiconductor element 4 directly on the wiring layer 5 or by bonding wires or by using the TAB tape.

It is desired that the wiring layer 5 comprises a low-resistance metal such as copper, silver or gold in order to minimize the conductor loss at the time of transmitting high-frequency signals. When the high-frequency signals of not lower than 1 GHz are to be transmitted through the wiring layer 5, it is desired that the wiring layer 5 is constituted by any one of a strip line, a microstrip line, a coplanar line or a dielectric waveguide so that high-frequency signals can be transmitted without loss. When the wiring layer 5 constitutes such a line, therefore, an electrically conducting layer such as ground layer is formed in the insulating substrate 1.

On the bottom surface of the insulating substrate 1 are formed electrode layers 6 for connection to the external electric circuit board B. The electrode layers 6 for connection are connected to the wiring layer 5 in the package A, and have ball-like terminals 8 that are secured by a brazing material 7 such as solder or the like. The external electric circuit board B has an insulating substrate 9 formed of an insulating material (having a coefficient of thermal expansion of 12 to 15 ppm/° C.) containing an organic resin, such as polyimide resin, epoxy resin or phenol resin, and a wiring layer 10 is formed on the insulating substrate 9. That is, the ball-like terminals 8 provided in the electrode layers 6 for connection of the insulating substrate 1 of the package A are connected to the wiring layer 10 of the external electric circuit board B using a brazing material 11 such as Pb—Sn, in order to electrically connect the wiring layer 5 in the package A to the wiring layer 10 of the external electric circuit board B. Upon melting the ball-like terminals 8, further, the electrode layers 6 for connection can be connected to the wiring layer 5.

As described above, the ceramics of the present invention constituting the insulating substrate 1 has a dielectric loss of not larger than $30 \times 10^{-4}$ at 60 to 77 GHz. In the above-mentioned package A, therefore, the high-frequency signals are effectively transmitted with low loss.

Besides, the ceramics constituting the insulating substrate 1 has a coefficient of thermal expansion of not smaller than 5.5 ppm/° C. Upon adjusting the amount of crystal phase that is precipitating and, particularly, the amount of quartz crystal phase that is precipitating, the coefficient of thermal expansion can be brought close to that of the chip 4 such as of GaAs or to that of the insulating substrate 9 of the external electric circuit board B (difference between the two can be decreased to be smaller than 2 ppm/° C.) to effectively decrease the stress caused by the difference in the thermal expansion. By forming the wiring board using the ceramics of the present invention, therefore, the mounting portion is effectively prevented from being broken and the wiring layer is effectively prevented from being peeled off or broken, that is caused by the thermal stress produced at the time of mounting a chip on the wiring board, at the time of mounting the wiring board on the external electric circuit board B, or by the repetition of operation and stop of the semiconductor element. Thus, the mounting structure maintains its reliability for extended periods of time.

EXAMPLE 1

There were prepared two kinds of crystallized glasses of the following compositions capable of precipitating the diopside oxide crystal phase.

Glass A: $SiO_2$ 50% by weight—$Al_2O_3$ 5.5% by weight—MgO 18.5% by weight—CaO 26% by weight Glass B: $SiO_2$ 52% by weight—$Al_2O_3$ 5% by weight—MgO 18% by weight—CaO 25% by weight.

The crystallized glass powders were mixed with a quartz powder having an average particle diameter of 5 μm in such amounts that the ceramics after fired possessed compositions as shown in Tables 1 and 2. To the mixture were added an organic binder, a plasticizer and toluene to prepare a slurry from which a green sheet having a thickness of 300 μm was prepared by the doctor blade method. The green sheets were laminated in a number of 10 to 15 sheets and were thermally adhered together at a temperature of 50° C. under a pressure of 100 kg/cm². The obtained laminate was subjected to the binder-removing treatment in a vapor-containing/nitrogen atmosphere at 700° C. and was fired in dry nitrogen under the conditions of Tables 1 and 2 to obtain ceramics for the insulating substrate.

The obtained ceramics were evaluated for their dielectric constants and dielectric tangents according to the methods described below. The ceramics were cut into disks of a diameter of 2 to 7 mm and a thickness of 1.5 to 2.5 mm, and the measurement was taken by the dielectric cylindrical resonance method at 60 GHz by using a network analyzer and a synthesized sweeper. The dielectric resonator was excited by an NRD guide (electromagnetic non-radiating dielectric line), and the dielectric constants and dielectric losses were calculated based on the resonance characteristics in the modes TE021, TE031.

Further, a curve of thermal expansion was plotted from room temperature up to 400° C. to calculate the coefficient of thermal expansion. The crystal phases in the sintered products were identified from an X-ray diffraction chart. The results were as shown in Tables 1 and 2.

The ratio of the glass phase in the ceramics was evaluated relying on the Liedbert method. Concretely speaking, the ceramics to be evaluated was pulverized, ZnO was added as an internal standard sample at a predetermined ratio, and ethanol was added thereto to prepare a wet mixture. The mixture was then dried and was subjected to the X-ray analysis to calculate the ratio of the glass phase in the ceramics from the ratio of addition of ZnO, ZnO obtained by the Rietvedd method and the ratio of the crystal phase in the ceramics.

Further, the ratio of silica ($SiO_2$) in the glass phase was measured by TEM.

For some samples, $ZrO_2$ powder and $CaZrO_3$ powder were used as filler components to substitute for quartz, and the ceramics were prepared and evaluated in the same manner (samples Nos. 8, 9, 10, 22 23, 24). Instead of the above-mentioned crystallized glasses A and B, further, a glass C of the following composition was used to evaluate in the same manner (Sample No. 25).

Glass C: $SiO_2$ 10.4% by weight—$Al_2O_3$ 2.5% by weight—$B_2O_3$ 45.3% by weight—CaO 35.2% by weight—$Na_2O$ 6.6% by weight As will be obvious from the results of Tables 1 and 2, the sample No. 14 in which the amount of glass containing $SiO_2$, $Al_2O_3$, MgO and CaO was greater than 99% by weight, exhibited dielectric loss of larger than $30\times10^{-4}$. The samples Nos. 12, 13 and 21 in which the amount of glass was smaller than 50% by weight, could not be sintered at a low temperature and possessed low densities. The samples Nos. 8 to 10 blended with $ZrO_2$ or $CaZrO_3$ as additives to the glass, permitted $ZrO_2$ and $CaZrO_3$ to precipitate in the sintered products and exhibited increased dielectric losses. The sample No. 25 using the glass C containing $B_2O_3$ in large amounts permitted the glass containing boron to remain in large amounts and exhibited an increased dielectric loss.

On the other hand, the samples Nos. 1 to 7, 11 and 15 to 20 to which the quartz powder was added in predetermined amounts according to the present invention, permitted the quartz phase to precipitate in the ceramics, and all exhibited excellent properties, such as coefficients of thermal expansion of not smaller than 8.5 ppm/° C., dielectric constants of not larger than 7 as measured at a frequency of 60 GHz, and dielectric losses of not larger than $30\times10^{-4}$.

TABLE 1

| Sample No. | Composition (% by wt) Glass Kind | Glass Amount | Filler Quartz | Filler Others | Firing condition Temp. (° C.) | Firing condition Time (hr) | Dielectric constant | Dielectric loss ($\times10^{-4}$) | Coefficient of thermal expansion (ppm/° C.) | Detected crystal phase note 1) | Glass phase (% by wt.) | $SiO_2$ ratio (% by wt.) |
|---|---|---|---|---|---|---|---|---|---|---|---|---|
| 1 | A | 95 | 5 | | 900 | 1 | 7 | 19 | 8.4 | DI>Si | 4 | 84 |
| 2 | A | 88 | 12 | | 950 | 1 | 6.8 | 15 | 8.7 | DI>Si | 4 | 85 |
| 3 | A | 85 | 15 | | 950 | 1 | 6.2 | 12 | 9 | DI>Si | 4 | 83 |
| 4 | A | 80 | 20 | | 950 | 1 | 6.1 | 10 | 9.4 | DI>Si | 4 | 79 |
| 5 | A | 75 | 25 | | 950 | 1 | 5.8 | 9 | 9.5 | DI>Si | 3 | 77 |
| 6 | A | 65 | 35 | | 975 | 1 | 5.6 | 8.5 | 9.6 | DI>Si | 3 | 75 |
| 7 | A | 58 | 42 | | 1000 | 1 | 5.4 | 7.5 | 10.3 | Si>DI | 3 | 72 |
| *8 | A | 90 | | $ZrO_2$ 10 | 950 | 1 | 8 | 40 | 8.5 | DI>Z>Si | 16 | 69 |
| *9 | A | 84 | | $ZrO_2$ 16 | 975 | 1 | 8.3 | 55 | 8.6 | DI>Z>Si | 11 | 71 |
| *10 | A | 83 | | $CaZrO_3$ 17 | 975 | 1 | 8.9 | 60 | 8.8 | DI>CZ>Si | 13 | 70 |
| 11 | A | 50 | 50 | | 1000 | 1 | 5.1 | 8 | 10.8 | Si>DI | 3 | 85 |
| *12 | A | 47 | 53 | | 1000 | 1 | not densified | | | | | |
| *13 | A | 30 | 30 | | 1000 | 1 | not densified | | | | | |

Samples marked with * lie outside the scope of the invention.
Note 1) DI: diopside Si: quartz Z: $ZrO_2$ CZ: $CaZrO_3$

TABLE 2

| Sample No. | Composition (% by wt) Glass Kind | Glass Amount | Filler Quartz | Filler Others | Firing condition Temp. (° C.) | Firing condition Time (hr) | Dielectric constant | Dielectric loss ($\times10^{-4}$) | Coefficient of thermal expansion (ppm/° C.) | Detected crystal phase note 1) | Glass phase (% by wt.) | $SiO_2$ ratio (% by wt.) |
|---|---|---|---|---|---|---|---|---|---|---|---|---|
| *14 | B | 99.5 | 0.5 | | 850 | 1 | 7.1 | 38 | 8.3 | DI>Si | 31 | 86 |
| 15 | B | 95 | 5 | | 900 | 1 | 7.1 | 22 | 8.5 | DI>Si | 26 | 85 |
| 16 | B | 86 | 14 | | 950 | 1 | 6.4 | 18 | 8.7 | DI>Si | 19 | 80 |
| 17 | B | 80 | 20 | | 950 | 1 | 6.2 | 12 | 9.5 | DI>Si | 16 | 78 |
| 18 | B | 75 | 25 | | 950 | 1 | 5.7 | 10 | 9.7 | DI>Si | 9 | 79 |
| 19 | B | 65 | 35 | | 975 | 1 | 5.6 | 9 | 10.9 | DI>Si | 8 | 80 |
| 20 | B | 51 | 49 | | 1000 | 1 | 5.3 | 8 | 11.5 | DI>Si | 6 | 82 |
| *21 | B | 48 | 52 | | 1000 | 1 | not densified | | | | | |
| *22 | B | 90 | | $ZrO_2$ 10 | 950 | 1 | 8 | 40 | 8.5 | DI>Z>Si | 38 | 66 |
| *23 | B | 84 | | $ZrO_2$ 16 | 975 | 1 | 8.3 | 55 | 8.6 | DI>Z>Si | 37 | 69 |
| *24 | B | 83 | | $CaZrO_3$ 17 | 975 | 1 | 8.9 | 60 | 8.8 | DI>CZ>Si | 40 | 70 |
| *25 | C | 50 | 50 | | 950 | 1 | 4.8 | 40 | 11.5 | Si others | 8 | 71 |

Samples marked with * lie outside the scope of the invention.
Note 1) DI: diopside Si: quartz Z: $ZrO_2$ CZ: $CaZrO_3$

EXAMPLE 2

By using the following glass powders D and E as crystallized glass powders and by using the blends of compositions shown in Tables 3 and 4, ceramics for the insulating substrate were obtained in the same manner as in Example 1.

Glass D: $SiO_2$ 50.2% by weight—$Al_2O_3$ 5.0% by weight—MgO 16.1% by weight—SrO 13.6% by weight—CaO 15.1% by weight Glass E: $SiO_2$ 47.5% by weight—$Al_2O_3$ 4.9% by weight—MgO 16.1% by weight—SrO 20% by weight—CaO 11.5% by weight.

The obtained ceramics for the insulating substrates were evaluated in the same manner as in Example 1. The results were as shown in Tables 3 and 4.

$CaZrO_3$ to precipitate in the sintered products and exhibited increased dielectric losses.

The samples Nos. 1 to 8 and 14 to 19 to which the quartz powder was chiefly added in predetermined amounts according to the present invention, permitted the quartz phase to precipitate in the ceramics, and all exhibited excellent properties, such as coefficients of thermal expansion of not smaller than 8.5 ppm/° C., dielectric constants of not larger than 7 at a frequency of 60 GHz and dielectric losses of not larger than $30 \times 10^{-4}$.

EXAMPLE 3-1

By using the crystallized glass powders A to C used in Example 1 and fillers shown in Tables 5 and 6, and using the

TABLE 3

| Sample No. | Composition (% by wt) | | | | Firing condition | | Dielectric constant | Dielectric loss ($\times 10^{-4}$) | Coefficient of thermal expansion (ppm/° C.) | Detected crystal phase (note 1) |
|---|---|---|---|---|---|---|---|---|---|---|
| | Glass | | Filler | | Temp. (° C.) | Time (hr) | | | | |
| | Kind | Amount | Quartz | Others | | | | | | |
| 1 | D | 95 | 5 | | 900 | 1 | 6.9 | 29 | 8.5 | DI>Si |
| 2 | D | 88 | 12 | | 900 | 1 | 6.7 | 25 | 8.9 | DI>Si |
| 3 | D | 85 | 15 | | 900 | 1 | 6.3 | 20 | 10 | DI>Si |
| 4 | D | 80 | 20 | | 900 | 1 | 6.2 | 18 | 10 | DI>Si |
| 5 | D | 75 | 25 | | 900 | 1 | 5.9 | 15 | 10.1 | DI>Si |
| 6 | D | 65 | 35 | | 950 | 1 | 5.7 | 16 | 10.2 | DI>Si |
| 7 | D | 58 | 42 | | 950 | 1 | 5.5 | 14 | 10.2 | Si>DI |
| 8 | D | 50 | 50 | | 990 | 1 | 5.2 | 13 | 10.7 | Si>DI |
| *9 | D | 47 | 53 | | 1000 | 1 | not densified | | | |
| *10 | D | 90 | | $ZrO_2$ 10 | 950 | 1 | 8 | 40 | 8.5 | DI>Z>Si |
| *11 | D | 84 | | $ZrO_2$ 16 | 975 | 1 | 8.3 | 55 | 8.6 | DI>Z>Si |
| *12 | D | 83 | | $CaZrO_3$ 17 | 975 | 1 | 8.9 | 60 | 8.8 | DI>CZ>Si |

Samples marked with * lie outside the scope of the invention.
Note 1) DI: diopside Si: quartz Z: $ZrO_2$ CZ: $CaZrO_3$

TABLE 4

| Sample No. | Composition (% by wt) | | | | Firing condition | | Dielectric constant | Dielectric loss ($\times 10^{-4}$) | Coefficient of thermal expansion (ppm/° C.) | Detected crystal phase (note 1) |
|---|---|---|---|---|---|---|---|---|---|---|
| | Glass | | Filler | | Temp. (° C.) | Time (hr) | | | | |
| | Kind | Amount | Quartz | Others | | | | | | |
| *13 | E | 99.5 | 0.5 | | 850 | 1 | 7.2 | 40 | 8.2 | DI>Si |
| 14 | E | 95 | 5 | | 890 | 1 | 6.9 | 27 | 8.6 | DI>Si |
| 15 | E | 86 | 14 | | 900 | 1 | 6.3 | 25 | 8.8 | DI>Si |
| 16 | E | 80 | 20 | | 900 | 1 | 6.1 | 20 | 9.7 | DI>Si |
| 17 | E | 75 | 25 | | 920 | 1 | 5.8 | 18 | 10 | DI>Si |
| 18 | E | 65 | 35 | | 950 | 1 | 5.7 | 15 | 10.7 | DI>Si |
| 19 | E | 51 | 49 | | 990 | 1 | 5.4 | 13 | 11.6 | DI>Si |
| *20 | E | 48 | 52 | | 1000 | 1 | not densified | | | |
| *21 | E | 90 | | $ZrO_2$ 10 | 930 | 1 | 8.1 | 50 | 8.4 | DI>Z>Si |
| *22 | E | 84 | | $ZrO_2$ 16 | 950 | 1 | 8.5 | 60 | 8.5 | DI>Z>Si |
| *23 | E | 83 | | $CaZrO_3$ 17 | 950 | 1 | 8.8 | 64 | 8.7 | DI>CZ>Si |

Samples marked with * lie outside the scope of the invention.
Note 1) DI: diopside Si: quartz Z: $ZrO_2$ CZ: $CaZrO_3$ As will be obvious from the results of Tables 3 and 4, the samples Nos. 10 to 12 and 21 to 23 blended with $ZrO_2$ and $CaZrO_3$ as additives to the glass, permitted $ZrO_2$ and blends of compositions shown in Tables 5 and 6, ceramics for the insulating substrate were prepared and evaluated. The results were as shown in Tables 5 and 6.

TABLE 5

| Sample No. | Glass Kind | Glass Amount | Filler MgTiO$_3$ | Filler Zn$_2$TiO$_4$ | Filler Others | Firing Temp. (°C) | Firing Time (hr) | Dielectric constant | Dielectric loss (×10$^{-4}$) | Coefficient of thermal expansion (ppm/°C) | Detected crystal phase note 1) |
|---|---|---|---|---|---|---|---|---|---|---|---|
| *1 | A | 99.5 | 0.5 | | | 850 | 1 | 7.2 | 35 | 8.1 | DI>I |
| 2 | A | 90 | 10 | | | 900 | 1 | 8 | 13 | 7.7 | DI>I |
| 3 | A | 90 | | 10 | | 900 | 1 | 10 | 15 | 8.7 | DI>SP |
| 4 | A | 80 | 20 | | | 900 | 1 | 8.3 | 10 | 8.6 | DI>I |
| 5 | A | 80 | | 20 | | 900 | 1 | 12 | 11 | 9.9 | DI>SP |
| 6 | A | 75 | 25 | | | 950 | 1 | 8.7 | 8 | 9 | DI>I |
| 7 | A | 60 | 40 | | | 1000 | 1 | 15 | 5 | 11 | DI>I |
| 8 | A | 60 | | 40 | | 975 | 1 | 21 | 10 | 10.4 | DI>SP |
| *9 | A | 90 | | | ZrO$_2$ 10 | 950 | 1 | 8 | 40 | 8.5 | DI>Z |
| *10 | A | 84 | | | ZrO$_2$ 16 | 975 | 1 | 8.3 | 55 | 8.6 | DI>Z |
| *11 | A | 83 | | | CaZrO$_3$ 17 | 975 | 1 | 8.9 | 60 | 8.8 | DI>CZ |
| 12 | A | 85 | | | Mg$_{0.1}$Zn$_{0.9}$TiO$_3$ 15 | 950 | 1 | 8.5 | 7 | 9.1 | DI>I |
| 13 | A | 77 | | | Mg$_2$TiO$_4$ 23 | 950 | 1 | 14 | 11 | 10 | DI>SP |
| *14 | A | 45 | | 55 | | 1000 | 1 | | not densified | | |
| 15 | A | 80 | 13 | 7 | | 950 | 1 | 10 | 11 | 9.5 | DI>I>SP |
| 16 | A | 70 | 22 | 8 | | 975 | 1 | 11.5 | 8 | 10.7 | DI>I>SP |
| 17 | A | 60 | 35 | 5 | | 1000 | 1 | 17 | 7 | 11.4 | DI>I>SP |

Samples marked with * lie outside the scope of the invention.
Note 1) DI: diopside I: ilmenite SP: spinel Z: ZrO$_2$ CZ: CaZrO$_3$

TABLE 6

| Sample No. | Glass Kind | Glass Amount | Filler MgTiO$_3$ | Filler Zn$_2$TiO$_4$ | Filler Others | Firing Temp. (°C) | Firing Time (hr) | Dielectric constant | Dielectric loss (×10$^{-4}$) | Coefficient of thermal expansion (ppm/°C) | Detected crystal phase note 1) |
|---|---|---|---|---|---|---|---|---|---|---|---|
| *18 | B | 99.5 | 0.5 | | | 850 | 1 | 7.4 | 37 | 8.5 | DI>I |
| 19 | B | 90 | 10 | | | 900 | 1 | 8.2 | 14 | 7.9 | DI>I |
| 20 | B | 90 | | 10 | | 900 | 1 | 10.3 | 15.5 | 8.8 | DI>SP |
| 21 | B | 80 | 20 | | | 900 | 1 | 8.5 | 11 | 8.9 | DI>I |
| 22 | B | 80 | | 20 | | 900 | 1 | 12.2 | 12 | 10 | DI>SP |
| 23 | B | 75 | 25 | | | 950 | 1 | 8.9 | 9 | 9.2 | DI>I |
| 24 | B | 60 | 40 | | | 1000 | 1 | 15.2 | 5.5 | 11.3 | DI>I |
| 25 | B | 60 | | 40 | | 980 | 1 | 21.2 | 11 | 10.5 | DI>SP |
| *26 | B | 90 | | | ZrO$_2$ 10 | 980 | 1 | 8.5 | 45 | 8.7 | DI>Z |
| *27 | B | 84 | | | ZrO$_2$ 16 | 975 | 1 | 8.6 | 57 | 8.5 | DI>Z |
| *28 | B | 83 | | | CaZrO$_3$ 17 | 975 | 1 | 9 | 64 | 8.7 | DI>CZ |
| 29 | B | 85 | | | Mg$_{0.1}$Zn$_{0.9}$TiO$_3$ 15 | 950 | 1 | 8.7 | 9 | 9.3 | DI>I |
| 30 | B | 77 | | | Mg$_2$TiO$_4$ 23 | 950 | 1 | 14.4 | 12 | 10.3 | DI>SP |
| *31 | B | 45 | | 55 | | 1000 | 1 | | not densified | | |
| *32 | C | 85 | | 15 | | 900 | 1 | | melted | | |
| *33 | C | 50 | | 50 | | 950 | 1 | 12 | >100 | 7.3 | I>CT>T |

Samples marked with * lie outside the scope of the invention.
Note 1) DI: diopside I: ilmenite SP: spinel Z: ZrO$_2$ CZ: CaZrO$_3$ T: TiO$_2$ CT: CaTiO$_3$ As will be obvious from the results of Tables 5 and 6, the samples Nos. 1 and 18 in which the amount of the glass A or B containing SiO$_2$, Al$_2$O$_3$, MgO and CaO was larger than 99% by weight, exhibited the dielectric losses of larger than 30×10$^{-4}$. The samples Nos. 14 and 31 in which the amount of glass was smaller than 50% by weight, could not be sintered at a low temperature and possessed low densities. The samples Nos. 9 to 11 and 26 to 28 blended with ZrO$_2$ and CazrO$_3$ as filler components to the glass, permitted ZrO$_2$ and CaZrO$_3$ to precipitate in the sintered products and exhibited increased dielectric losses. The sample No. 32 using the glass C containing B$_2$O$_3$ in large amounts was melted. Further, the sample No. 33 permitted the diopside crystal phase to be extinguished and, hence, the glass containing much boron remained in large amounts to exhibit an increased dielectric loss.

On the other hand, the samples Nos. 2 to 8, 12, 13, 15 to 27, 19 to 25, 29 and 30 to which was added an oxide containing Mg and/or Zn and Ti in predetermined amounts according to the present invention, permitted the composite oxide crystal phase containing Mg and/or Zn and Ti to precipitate in the ceramics, and all exhibited excellent properties, such as coefficients of thermal expansion of not smaller than 7 ppm/° C., dielectric constants of not smaller than 8 and dielectric losses of not larger than 30×10$^{-4}$ at 60 to 77 GHz.

EXAMPLE 3-2

By using the crystallized glass powders D and E used in Example 2 and fillers shown in Tables 7 and 8, and using the blends of compositions shown in Tables 7 and 8, ceramics for the insulating substrate were prepared and evaluated in the same manner as in Example 1. The results were as shown in Tables 7 and 8.

densities. The samples Nos. 42 to 44 and 59 to 61 blended with $ZrO_2$ and $CaZrO_3$ as filler components to the glass, permitted $ZrO_2$ and $CaZrO_3$ to precipitate in the sintered products and exhibited increased dielectric losses.

On the other hand, the samples Nos. 35 to 41, 45, 46, 48 to 50, 52 to 58, 62 and 63 to which was added an oxide containing Mg and/or Zn and Ti in predetermined amounts according to the present invention, permitted the composite

TABLE 7

| Sample No. | Glass Kind | Glass Amount | Filler $MgTiO_3$ | Filler $Zn_2TiO_4$ | Filler Others | Firing Temp. (°C.) | Firing Time (hr) | Dielectric constant | Dielectric loss ($\times 10^{-4}$) | Coefficient of thermal expansion (ppm/°C.) | Detected crystal phase note 1) |
|---|---|---|---|---|---|---|---|---|---|---|---|
| *34 | D | 99.5 | 0.5 | | | 830 | 1 | 7.3 | 40 | 8.2 | DI>I |
| 35 | D | 90 | 10 | | | 850 | 1 | 8.3 | 14 | 7.9 | DI>I |
| 36 | D | 90 | | 10 | | 850 | 1 | 10.2 | 16 | 9 | DI>SP |
| 37 | D | 80 | 20 | | | 850 | 1 | 8.5 | 11 | 8.8 | DI>I |
| 38 | D | 80 | | 20 | | 850 | 1 | 12.3 | 13 | 10.2 | DI>SP |
| 39 | D | 75 | 25 | | | 900 | 1 | 9 | 10 | 9.1 | DI>I |
| 40 | D | 60 | 40 | | | 950 | 1 | 15.1 | 8 | 11.3 | DI>I |
| 41 | D | 60 | | 40 | | 950 | 1 | 21.2 | 12 | 10.5 | DI>SP |
| *42 | D | 90 | | | $ZrO_2$ 10 | 930 | 1 | 7.9 | 50 | 8.7 | DI>Z |
| *43 | D | 84 | | | $ZrO_2$ 16 | 950 | 1 | 8.5 | 60 | 8.8 | DI>Z |
| *44 | D | 83 | | | $CaZrO_3$ 17 | 950 | 1 | 9 | 65 | 9 | DI>CZ |
| 45 | D | 85 | | | $Mg_{0.1}Zn_{0.9}TiO_3$ 15 | 900 | 1 | 8.7 | 10 | 9.2 | DI>I |
| 46 | D | 77 | | | $Mg_2TiO_4$ 23 | 900 | 1 | 14.2 | 14 | 10.2 | DI>SP |
| *47 | D | 45 | | 55 | | 1000 | 1 | not densified | | | |
| 48 | D | 80 | 13 | 7 | | 900 | 1 | 10.3 | 13 | 9.6 | DI>I>SP |
| 49 | D | 70 | 22 | 8 | | 930 | 1 | 11.7 | 10 | 10.8 | DI>I>SP |
| 50 | D | 60 | 35 | 5 | | 950 | 1 | 17.2 | 9 | 11.5 | DI>I>SP |

Samples marked with * lie outside the scope of the invention.
Note 1) DI: diopside I: ilmenite SP: spinel Z: $ZrO_2$ CZ: $CaZrO_3$

TABLE 8

| Sample No. | Glass Kind | Glass Amount | Filler $MgTiO_3$ | Filler $Zn_2TiO_4$ | Filler Others | Firing Temp. (°C.) | Firing Time (hr) | Dielectric constant | Dielectric loss ($\times 10^{-4}$) | Coefficient of thermal expansion (ppm/°C.) | Detected crystal phase note 1) |
|---|---|---|---|---|---|---|---|---|---|---|---|
| *51 | E | 99.5 | 0.5 | | | 820 | 1 | 7.3 | 40 | 8.4 | DI>I |
| 52 | E | 90 | 10 | | | 850 | 1 | 8.5 | 17 | 7.8 | DI>I |
| 53 | E | 90 | | 10 | | 850 | 1 | 10.5 | 16 | 9 | DI>SP |
| 54 | E | 80 | 20 | | | 850 | 1 | 8.7 | 12 | 9.1 | DI>I |
| 55 | E | 80 | | 20 | | 850 | 1 | 12.4 | 13 | 11 | DI>SP |
| 56 | E | 75 | 25 | | | 875 | 1 | 9 | 11 | 9.5 | DI>I |
| 57 | E | 60 | 40 | | | 950 | 1 | 15.4 | 7 | 11.5 | DI>I |
| 58 | E | 60 | | 40 | | 950 | 1 | 21.3 | 12 | 10.7 | DI>SP |
| *59 | E | 90 | | | $ZrO_2$ 10 | 930 | 1 | 8.7 | 48 | 9 | DI>Z |
| *60 | E | 84 | | | $ZrO_2$ 16 | 950 | 1 | 8.8 | 59 | 8.8 | DI>Z |
| *61 | E | 83 | | | $CaZrO_3$ 17 | 950 | 1 | 9.2 | 65 | 8.9 | DI>CZ |
| 62 | E | 85 | | | $Mg_{0.1}Zn_{0.9}TiO_3$ 15 | 900 | 1 | 8.9 | 10 | 9.5 | DI>I |
| 63 | E | 77 | | | $Mg_2TiO_4$ 23 | 900 | 1 | 14.6 | 13 | 10.5 | DI>SP |
| *64 | E | 45 | | 55 | | 1000 | 1 | not densified | | | |

Samples marked with * lie outside the scope of the invention.
Note 1) DI: diopside I: ilmenite SP: spinel Z: $ZrO_2$ CZ: $CaZrO_3$ T: $TiO_2$ CT: $CaTiO_3$ As will be obvious from the results of Tables 7 and 8, the samples Nos. 34 and 56 in which the amount of the glass D or E containing $SiO_2$, $Al_2O_3$, MgO, SrO and CaO was larger than 99% by weight, exhibited the dielectric losses of larger than $30\times10^{-4}$. The samples Nos. 47 and 64 in which the amount of the glass was smaller than 50% by weight, could not be sintered at a low temperature and possessed low oxide crystal phase containing Mg and/or Zn and Ti to precipitate in the ceramics, and all exhibited excellent properties, such as coefficients of thermal expansion of not smaller than 7 ppm/° C., dielectric constants of not smaller than 8 and dielectric losses of not larger than $30\times10^{-4}$ at 60 to 77 GHz.

It will be further understood that when the SrO-containing glass powder is used, the firing can be accomplished at a temperature of not higher than 900° C.

EXAMPLE 4-1

By using the crystallized glass powders A to C used in Example 1 and fillers shown in Tables 9 and 10, and using the blends of compositions shown in Tables 9 and 10, ceramics for the insulating substrate were prepared and evaluated in the same manner as in Example 1. The results were as shown in Tables 9 and 10.

sintered at low temperatures and possessed low densities. The samples Nos. 13 to 15 and 27 to 29 blended with $ZrO_2$ and $CaZrO_3$ as filler components to the glass, permitted $ZrO_2$ and $CaZrO_3$ to precipitate in the sintered products and exhibited increased dielectric losses. The sample No. 30 using the glass C containing $B_2O_3$ in large amounts permitted the glass containing boron to remain in large amounts and exhibited an increased dielectric loss.

On the other hand, the samples Nos. 1 to 12, 17 to 22 and 24 to 26 to which was added chiefly the quartz powder in predetermined amounts according to the present invention, permitted the quartz phase to precipitate in the ceramics, and

TABLE 9

| Sample No. | Composition (% by wt) Glass Kind | Glass Amount | Filler Quartz | Filler Others | Firing temperature (° C.) | Dielectric constant | Dielectric loss (×10⁻⁴) | Coefficient of thermal expansion (ppm/° C.) | Detected crystal phase note 1) |
|---|---|---|---|---|---|---|---|---|---|
| 1 | A | 50 | 49.9 | MgSiO₃ 0.1 | 1000 | 5.2 | 7 | 11 | Si>DI>MS |
| 2 | A | 95 | 4 | MgSiO₃ 1 | 900 | 7.0 | 17 | 8.5 | DI>Si>MS |
| 3 | A | 88 | 10 | MgSiO₃ 2 | 950 | 6.9 | 13 | 8.9 | DI>Si>MS |
| 4 | A | 85 | 10 | MgSiO₃ 5 | 950 | 6.5 | 10 | 9.5 | DI>Si>MS |
| 5 | A | 80 | 10 | MgSiO₃ 10 | 960 | 6.6 | 9 | 9.6 | DI>Si>MS |
| 6 | A | 70 | 15 | MgSiO₃ 15 | 975 | 6.0 | 8 | 10.0 | DI>Si>MS |
| 7 | A | 58 | 22 | MgSiO₃ 20 | 1000 | 5.6 | 7.7 | 10.5 | Si>DI>MS |
| 8 | A | 65 | 32 | Mg₂SiO₄ 3 | 975 | 5.8 | 8.0 | 9.8 | DI>Si>M₂S |
| 9 | A | 80 | 15 | Mg₂SiO₄ 5 | 975 | 6.3 | 9.5 | 9.6 | DI>Si>M₂S |
| 10 | A | 75 | 15 | Mg₂SiO₄ 10 | 975 | 6.1 | 8.0 | 9.7 | DI>Si>M₂S |
| 11 | A | 75 | 15 | MgO 10 | 950 | 6.3 | 7.2 | 10.5 | DI>Si>M₂S |
| 12 | A | 75 | 15 | Mg(OH)₂ 10 | 950 | 6.1 | 6.8 | 10.3 | DI>Si>M₂S |
| *13 | A | 90 | | ZrO₂ 10 | 950 | 8 | 40 | 8.5 | DI>Z>Si |
| *14 | A | 84 | | ZrO₂ 16 | 975 | 8.3 | 55 | 8.6 | DI>Z>Si |
| *15 | A | 83 | | CaZrO₃ 17 | 975 | 8.9 | 60 | 8.8 | DI>CZ>Si |
| *16 | A | 47 | 51 | MgSiO₃ 2 | 1000 | | not densified | | |

Samples marked with * lie outside the scope of the invention.
Note 1) DI: diopside Si: quartz Z: $ZrO_2$ CZ: $CaZrO_3$ MS: enstatite $M_2S$: forsterite

TABLE 10

| Sample No. | Composition (% by wt) Glass Kind | Glass Amount | Filler Quartz | Filler Others | Firing temperature (° C.) | Dielectric constant | Dielectric loss (×10⁻⁴) | Coefficient of thermal expansion (ppm/° C.) | Detected crystal phase note 1) |
|---|---|---|---|---|---|---|---|---|---|
| 17 | B | 95 | 2 | MgSiO₃ 3 | 900 | 7.0 | 20 | 8.6 | DI>Si>MS |
| 18 | B | 86 | 13 | MgSiO₃ 1 | 950 | 6.5 | 16 | 8.9 | DI>Si>MS |
| 19 | B | 80 | 15 | MgSiO₃ 5 | 950 | 6.7 | 15 | 9.5 | DI>Si>MS |
| 20 | B | 75 | 15 | MgSiO₃ 10 | 950 | 6.3 | 13 | 10.3 | DI>Si>MS |
| 21 | B | 65 | 20 | MgSiO₃ 15 | 975 | 5.9 | 12 | 11.0 | DI>Si>MS |
| 22 | B | 51 | 29 | MgSiO₃ 20 | 1000 | 5.3 | 8 | 11.5 | DI>Si>MS |
| *23 | B | 48 | 51 | MgSiO₃ 1 | 1000 | | not densified | | |
| 24 | B | 75 | 15 | Mg₂SiO₄ 10 | 975 | 6.0 | 8 | 9.8 | DI>Si>M₂S |
| 25 | B | 75 | 15 | MgO 10 | 950 | 6.5 | 10 | 10.3 | DI>Si>M₂S |
| 26 | B | 75 | 15 | Mg(OH)₂ 10 | 950 | 6.3 | 9 | 10.4 | DI>Si>M₂S |
| *27 | B | 90 | 0 | ZrO₂ 10 | 950 | 8 | 40 | 8.5 | DI>Z>Si |
| *28 | B | 84 | 0 | ZrO₂ 16 | 975 | 8.3 | 55 | 8.6 | DI>Z>Si |
| *29 | B | 83 | 0 | CaZrO₃ 17 | 975 | 8.9 | 60 | 8.8 | DI>CZ>Si |
| *30 | C | 50 | 40 | MgSiO₃ 10 | 950 | 4.8 | 40 | 11.5 | Si others |

Samples marked with * lie outside the scope of the invention.
Note 1) DI: diopside Si: quartz Z: $ZrO_2$ CZ: $CaZrO_3$ MS: enstatite $M_2S$: forsterite As will be obvious from the results of Tables 9 and 10, the samples Nos. 16 to 23 in which the amount of either the quartz which is a filler or the composite oxide of Mg and Si was larger than a predetermined amount, could not be all exhibited excellent properties, such as coefficients of thermal expansion of not smaller than 8.5 ppm/° C., dielectric constants of not larger than 7 at a frequency of 60 GHz and dielectric losses of not larger than $30 \times 10^{-4}$ and, particularly, not larger than $20 \times 10^{-4}$.

EXAMPLE 4-2

By using the crystallized glass powders D and E used in Example 2 and fillers shown in Tables 11 and 12, and using the blends of compositions shown in Tables 11 and 12, ceramics for the insulating substrate were prepared and evaluated in the same manner as in Example 1. The results were as shown in Tables 11 and 12.

The samples Nos. 43 to 45 and 57 to 59 blended with $ZrO_2$ and $CaZrO_3$ as additives to the glass, permitted $ZrO_2$ and $CaZrO_3$ to precipitate in the sintered products and exhibited increased dielectric losses.

On the other hand, the samples Nos. 31, 32, 42, 47 to 52 and 54 to 56 to which was added chiefly the quartz powder in predetermined amounts according to the present invention, permitted the quartz phase to precipitate in the

TABLE 11

| Sample No. | Composition (% by wt) | | | | Firing temperature (°C.) | Dielectric constant | Dielectric loss (×10⁻⁴) | Coefficient of thermal expansion (ppm/°C.) | Detected crystal phase note 1) |
|---|---|---|---|---|---|---|---|---|---|
| | Glass | | Filler | | | | | | |
| | Kind | Amount | Quartz | Others | | | | | |
| 31 | D | 50 | 49.9 | MgSiO₃ 0.1 | 990 | 5.3 | 7 | 11 | Si>DI>MS |
| 32 | D | 95 | 4 | MgSiO₃ 1 | 890 | 7.0 | 25 | 8.7 | DI>Si>MS |
| 33 | D | 88 | 10 | MgSiO₃ 2 | 940 | 6.9 | 20 | 9.2 | DI>Si>MS |
| 34 | D | 85 | 10 | MgSiO₃ 5 | 940 | 6.5 | 15 | 9.5 | DI>Si>MS |
| 35 | D | 80 | 10 | MgSiO₃ 10 | 940 | 6.6 | 16 | 10.2 | DI>Si>MS |
| 36 | D | 70 | 15 | MgSiO₃ 15 | 965 | 6.3 | 17 | 10.9 | DI>Si>MS |
| 37 | D | 58 | 22 | MgSiO₃ 20 | 990 | 5.6 | 14 | 10.5 | Si>DI>MS |
| 38 | D | 65 | 32 | Mg₂SiO₄ 3 | 965 | 5.8 | 15 | 9.8 | DI>Si>M₂S |
| 39 | D | 80 | 15 | Mg₂SiO₄ 5 | 965 | 6.3 | 16 | 9.6 | DI>Si>M₂S |
| 40 | D | 75 | 15 | Mg₂SiO₄ 10 | 965 | 6.1 | 17 | 9.7 | DI>Si>M₂S |
| 41 | D | 75 | 15 | MgO 10 | 965 | 6.5 | 12 | 10.3 | DI>Si>M₂S |
| 42 | D | 75 | 15 | Mg(OH)₂ 10 | 965 | 6.3 | 11 | 10.1 | DI>Si>M₂S |
| *43 | D | 90 | | ZrO₂ 10 | 940 | 8 | 45 | 8.5 | DI>Z>Si |
| *44 | D | 84 | | ZrO₂ 16 | 965 | 8.3 | 59 | 8.7 | DI>Z>Si |
| *45 | D | 83 | | CaZrO₃ 17 | 965 | 8.9 | 65 | 8.8 | DI>CZ>Si |
| *46 | D | 47 | 51 | MgSiO₃ 2 | 1000 | not densified | | | |

Samples marked with * lie outside the scope of the invention.
Note 1) DI: diopside Si: quartz Z: ZrO₂ CZ: CaZrO₃ MS: enstatite M₂S: forsterite

TABLE 12

| Sample No. | Composition (% by wt) | | | | Firing temperature (°C.) | Dielectric constant | Dielectric loss (×10⁻⁴) | Coefficient of thermal expansion (ppm/°C.) | Detected crystal phase note 1) |
|---|---|---|---|---|---|---|---|---|---|
| | Glass | | Filler | | | | | | |
| | Kind | Amount | Quartz | Others | | | | | |
| 47 | E | 95 | 2 | MgSiO₃ 3 | 890 | 7.0 | 20 | 9.1 | DI>Si>MS |
| 48 | E | 86 | 13 | MgSiO₃ 1 | 940 | 6.7 | 18 | 9.5 | DI>Si>MS |
| 49 | E | 80 | 15 | MgSiO₃ 5 | 940 | 6.3 | 15 | 10.1 | DI>Si>MS |
| 50 | E | 75 | 15 | MgSiO₃ 10 | 940 | 6.2 | 13 | 10.3 | DI>Si>MS |
| 51 | E | 65 | 20 | MgSiO₃ 15 | 965 | 5.6 | 12 | 11.2 | DI>Si>MS |
| 52 | E | 51 | 29 | MgSiO₃ 20 | 990 | 5.5 | 11 | 11.6 | DI>Si>MS |
| *53 | E | 48 | 51 | MgSiO₃ 1 | 1000 | not densified | | | |
| 54 | E | 75 | 15 | Mg₂SiO₄ 10 | 965 | 6.2 | 10 | 9.8 | DI>Si>M₂S |
| 55 | E | 75 | 15 | MgO 10 | 940 | 5.9 | 12 | 10.5 | DI>Si>M₂S |
| 56 | E | 75 | 15 | Mg(OH)₂ 10 | 940 | 5.8 | 10 | 10.4 | DI>Si>M₂S |
| *57 | E | 90 | 0 | ZrO₂ 10 | 940 | 8.3 | 50 | 8.5 | DI>Z>Si |
| *58 | E | 84 | 0 | ZrO₂ 16 | 965 | 8.5 | 60 | 8.6 | DI>Z>Si |
| *59 | E | 83 | 0 | CaZrO₃ 17 | 965 | 9.0 | 65 | 8.8 | DI>CZ>Si |

Samples marked with * lie outside the scope of the invention.
Note 1) DI: diopside Si: quartz Z: ZrO₂ CZ: CaZrO₃ MS: enstatite M₂S: forsterite As will be obvious from the results of Tables 11 and 12, the samples Nos. 46 and 53 in which the amount of either the quartz which is a filler or the composite oxide of Mg and Si was larger than a predetermined amount, could not be sintered at low temperatures and possessed low densities.

ceramics, and all exhibited excellent properties, such as coefficients of thermal expansion of not smaller than 8.5 ppm/°C., dielectric constants of not larger than 7 at a frequency of 60 GHz and dielectric losses of not larger than $30 \times 10^{-4}$ and, particularly, not larger than $10 \times 10^{-4}$.

What is claimed is:

1. Dielectric ceramics comprising:

a diopside oxide crystal phase;

at least one crystal phase selected from the group consisting of a quartz crystal phase and a composite oxide crystal phase containing Ti and Mg or Zn; and a glass phase of an amount of not larger than 30% by weight;

said dielectric ceramics having a coefficient of thermal expansion of not smaller than 5.5 ppm/° C. at room temperature to 400° C. and a dielectric loss of not larger than $30\times10^{-4}$ at 60 to 77 GHz.

2. Dielectric ceramics according to claim 1, wherein an ilmenite crystal phase or a spinel crystal phase is contained as a composite oxide crystal phase containing Ti and Mg or Zn.

3. Dielectric ceramics according to claim 1, wherein not less than 70% by weight of said glass phase is amorphous silica.

4. Dielectric ceramics according to claim 1, wherein said quartz crystals are contained in an amount of from 1 to 50% by weight.

5. Dielectric ceramics according to claim 2, wherein said composite oxide crystal phase containing Ti and Mg or Zn is contained in an amount of from 1 to 50% by weight.

6. Dielectric ceramics according to claim 1, wherein SrO is contained in said diopside oxide crystal phase or in said glass phase.

7. Dielectric ceramics according to claim 1, further comprising a $MgSiO_3$ crystal phase or a $Mg_2SiO_4$ crystal phase.

8. Dielectric ceramics according to claim 7, wherein the $MgSiO_3$ crystal phase and the $Mg_2SiO_4$ crystal phase are contained in a total amount of from 0.1 to 20% by weight.

9. Dielectric ceramics according to claim 4, containing the quartz crystal phase, and having a coefficient of thermal expansion of not smaller than 8.5 ppm/° C. at room temperature up to 400° C. and a dielectric constant of not larger than 7.

10. Dielectric ceramics according to claim 5, containing the composite oxide crystal phase containing Ti and Mg or Zn, and having a coefficient of thermal expansion of not smaller than 7 ppm/° C. at room temperature up to 400° C. and a dielectric constant of not smaller than 8.

11. A wiring board equipped with an insulating substrate comprising dielectric ceramics of claim 1.

* * * * *